United States Patent [19]

Harth

[11] 3,836,990

[45] Sept. 17, 1974

[54] ELECTRICAL COMPONENT

[75] Inventor: Wolfgang Harth, Braunschweig, Germany

[73] Assignee: Licentia Patent-Verwaltungs-G.m.b.H., Frankfurt/Main, Germany

[22] Filed: Feb. 16, 1973

[21] Appl. No.: 332,814

[30] Foreign Application Priority Data

Mar. 2, 1972 Germany .......... 2209979

[52] U.S. Cl. .......... 317/234, 317/234 S, 317/234 T, 317/235 K, 317/235 AM, 317/235 AD, 317/235 T

[51] Int. Cl. .......... H01l 3/00

[58] Field of Search .......... 317/234 S, 234 T, 235 K, 317/235 AM, 235 AD, 235 T

[56] References Cited

UNITED STATES PATENTS

| | | | |
|---|---|---|---|
| 2,899,652 | 8/1959 | Read | 333/80 |
| 3,445,733 | 5/1969 | Esaki | 317/234 |
| 3,483,445 | 12/1969 | Forlani | 317/234 |

OTHER PUBLICATIONS

Magil, P. I.B.M. Tech. Discl. Bull., Vol. 5, No. 10, March 1963.

*Primary Examiner*—Martin H. Edlow
*Attorney, Agent, or Firm*—Spencer & Kaye

[57] ABSTRACT

An electrical component comprises a multilayer body having a layer sequence metal, insulator, semiconductor, metal.

9 Claims, 2 Drawing Figures

ELECTRICAL COMPONENT

BACKGROUND OF THE INVENTION

The invention relates to an electrical component.

SUMMARY OF THE INVENTION

It is an object of the invention to provide a new electrical component, which can be used for example as a delay diode and which is suitable for example for use in oscillators or electrical amplifiers.

According to the invention, there is provided an electrical component comprising a body formed of a plurality of layers having a layer sequence metal, insulator, semiconductor, metal.

Further according to the invention, there is provided an electrical component comprising a semiconductor body, a first metal layer on a first surface of said semi conductor body, an insulating layer on a second surface of said semiconductor body opposite to said first surface and a second metal layer on said insulating layer.

BRIEF DESCRIPTION OF THE DRAWINGS

One embodiment of the invention will now be described, by way of example with reference to the drawings, in which.

DESCRIPTION OF THE PREFERRED EMBODIMENT

Basically the invention proposes that the electrical component should comprise the layer sequence metal, insulator, semiconductor, metal. Such a component can be termed an MIS-delay diode.

The invention has the advantage that low-noise oscillators with a low harmonic content and amplifiers in the frequency range between $10^9$ and $10^{11}$ Hz can be produced with the new electrical component.

The electrical component according to the invention comprises for example a semiconductor body with metal layers applied to opposite sides of the semiconductor body, which metal layers can be also called electrodes. One metal layer is, however, not applied directly to the semiconductor body, but is separated from the semiconductor body by an insulating layer. The metal layer arranged on the opposite side of the semiconductor body is, on the other hand, applied directly to the semiconductor body. The application of the metal layers is effected by vaporisation in high vacuum and that of the insulating layer by known chemical methods.

The insulating layer between the semiconductor body and one metal layer is preferably made so thin that it can be tunnelled by electrons. For this purpose, the insulating layer is made for example 30 to 50 Angstrom thick. For example, $SiO_2$, $Si_3N_4$ or $Al_2O_3$ can be used as material for the insulating layer.

The semiconductor body of the electrical component preferably comprises a plurality of layers of the same type of conductivity but of differing conductance. In accordance with one form of embodiment of the invention, the semiconductor has for example a $n^+nn^+$-layer sequence. The $n^+$-layer adjoining the insulating layer in this case has for example a conductance of 0.1 ohmcm. The other $n^+$-layer directly adjoining the metal layer also has for example the same conductance of 0.1 ohmcm. A conductance of 1.0 ohmcm is recommended for the centre $n$-layer between the two $n^+$-layers.

The thickness of the $n^+$-layer adjoining the insulating layer amounts to approximately 1,000 A, the thickness of the other $n^+$-layer which directly adjoins one metal layer, is for example 10 $\mu$m, whereas the centre $n$-layer between the two $n^+$-layers has for example a thickness of between 1 and 50 $\mu$m. The semiconductor body of the arrangement in accordance with the invention comprises, for example, silicon. The electrical component according to the invention is preferably driven in the reverse direction.

Figure 1:
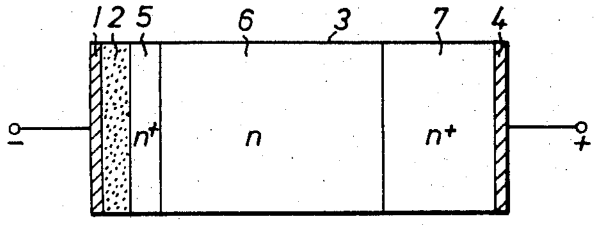
FIG. 1 is a schematic diagram of one embodiment of an electrical component in accordance with the invention.

Referring now to the drawings, FIG. 1 shows a form of embodiment of the invention with the layer sequence metal (1), insulator (2), semiconductor body (30) and metal (4). In the exemplary embodiment, the semiconductor body 3 likewise comprises a layer sequence, that is to say of $n^+$-layer 5, which adjoins the insulating layer 2, the centre $n$-layer 6 and a further $n^+$-layer 7, which does not adjoin an insulating layer but the metal layer 4.

Figure 2:
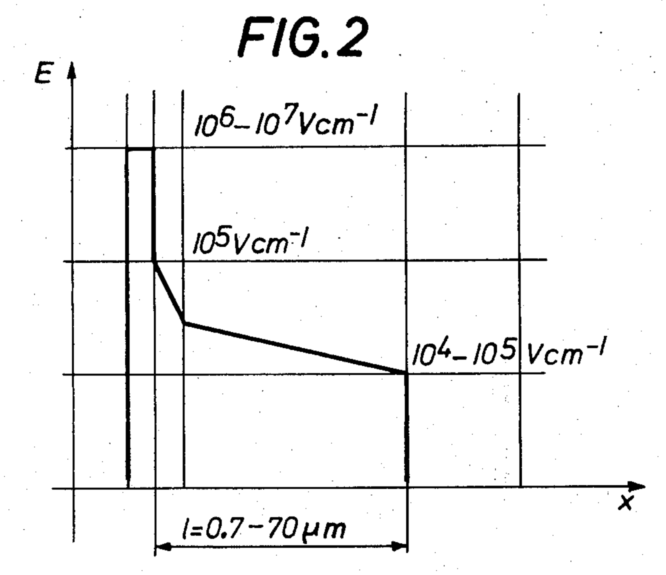
FIG. 2 is a graph showing the field distribution of a component as shown in FIG. 1.

If a blocking voltage is applied to the arrangement of FIG. 1 in such a manner that the negative pole is located on the metal layer 1 adjoining the insulating layer 2 and the positive pole is located at the other metal layer 4 directly adjoining the semiconductor body, there thus results, for example, a field pattern as is shown in FIG. 2. In FIG. 2, the spacing from the left-hand metal layer 1 in $\mu$m is plotted on the abscissae, whereas the ordinates give the field strength E IN V/cm.

If the insulating layer 2 is made correspondingly thin, it can be tunnelled through by electrons in the driving state, current densities in the order of magnitude of, for example, $10^3$A/cm$^2$ being injected into the semiconductor body 3. A tunnelling of the insulating layer 2 is achieved for example if the insulating layer 2 is 30 to 50 A thick.

The thin $n^+$-layer 5 adjoining the insulating layer 2 has the task of allowing the electrical field in the semiconductor to drop rapidly to a value at which indeed the speed of the electrons is still saturated, but yet no noticeable ionization by impact can occur. The $n^+$-layer 5 is made, for example, 1,000 A thick. A negative resistance band occurs as a result of the delay in the semiconductor between the current and the voltage, caused by the delay time, if the delay angle $\phi = \omega l/v$ is between $\pi$ and $2\pi$. In this $\omega$ is the circuit frequency, $l$ is the thickness of the space charge region, which is formed in the layers 5 and 6 and $v$ is the electron drift speed.

It will be understood that the above description of the present invention is susceptible to various modifications, changes and adaptations.

What is claimed is:

1. In an electrical component including a semiconductor body of one conductivity type, a first metal layer on a first surface of said semiconductor body, a layer of insulating material on a second surface of said semiconductor body opposite to said first surface, and a second metal layer on said insulating layer, said insulating layer having a thickness such that it can be tunnelled through by electrons, the improvement wherein: said said semiconductor body comprises a plurality of layers of different conductance; and, the one of said layers of said semiconductor body which is adjacent said insulating layer is relatively thin and is more highly doped than the adjacent layer of said semiconductor body, said one layer being sufficiently thin so as to allow the electric field in the semiconductor body to rapidly fall to a value at which no noticeable ionization by impact can occur.

2. A component as defined in claim 1, wherein said insulating layer is 30 to 50 Angstroms thick.

3. A component as defined in claim 2, wherein said insulating material is selected from the group consisting of $SiO_2$, $Si_3N_4$ and $Al_2O_3$.

4. A component as defined in claim 1 wherein said one of said layers has a thickness of the order of 1,000 Angstroms.

5. A component as defined in claim 4, wherein said semiconductor body is of *n*-type conductivity and comprises a plurality of layers having an $n^+$ $nn^+$ layer sequence.

6. A component as defined in claim 5, wherein said one of said said $n^+$ layers which is adjacent to said insulating layer has a conductance of 0.1 ohmcm.

7. A component as defined in claim 6 wherein said n layer has a conductance of 1.0 ohmcm.

8. A component as defined in claim 7 wherein the other of said $n^+$ layers is provided adjacent to said first metal layer and has a conductance of 0.1 ohmcm.

9. A component as defined in claim 8, wherein said n layer has a thickness of from 1 to 50 $\mu$m.

* * * * *